US012106813B2

(12) United States Patent
Shukla et al.

(10) Patent No.: US 12,106,813 B2
(45) Date of Patent: Oct. 1, 2024

(54) DYNAMIC PRIORITIZATION OF SELECTOR $V_T$ SCANS

(71) Applicant: Micron Technology, Inc., Boise, ID (US)

(72) Inventors: Pitamber Shukla, Boise, ID (US); Avinash Rajagiri, Boise, ID (US); Devin Batutis, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 230 days.

(21) Appl. No.: 17/733,460

(22) Filed: Apr. 29, 2022

(65) Prior Publication Data
US 2023/0195355 A1 Jun. 22, 2023

Related U.S. Application Data

(60) Provisional application No. 63/291,206, filed on Dec. 17, 2021.

(51) Int. Cl.
*G11C 29/02* (2006.01)
*G06F 11/07* (2006.01)
(Continued)

(52) U.S. Cl.
CPC ............ *G11C 29/02* (2013.01); *G06F 11/073* (2013.01); *G11C 29/006* (2013.01); *G11C 2029/0403* (2013.01)

(58) Field of Classification Search
CPC ..... G11C 29/02; G11C 29/006; G11C 29/024; G11C 29/50; G11C 29/56;
(Continued)

(56) References Cited

U.S. PATENT DOCUMENTS

| 9,430,603 B1* | 8/2016 | Foreman ............... G06F 30/367 |
| 2012/0102259 A1* | 4/2012 | Goss ..................... G11C 16/26 |
| | | 711/E12.001 |

(Continued)

FOREIGN PATENT DOCUMENTS

WO 2017074570 A1 5/2017

OTHER PUBLICATIONS

Choudhuri, et al., "Performance Improvement of Block Based NAND Flash Translation Layer", retrieved from https://www.ics.uci.edu/~givargis/pubs/C32.pdf., Sep. 30-Oct. 3, 2007, 6 pages.

*Primary Examiner* — Matthew M Kim
*Assistant Examiner* — Matthew N Putaraksa
(74) *Attorney, Agent, or Firm* — Brooks, Cameron & Huebsch, PLLC

(57) ABSTRACT

Prioritization of $V_T$ scans can be performed using particular select gates of a memory device or memory sub-system in the absence of performing such select gate scan operations on all of the select gates of an entire memory die or of all the memory dice of a memory device or memory sub-system. A method for such prioritization of $V_T$ scans includes determining quality characteristics of a memory die and altering a threshold voltage applied to the memory die in performance of a select gate scan operation based, at least in part, on the determined quality characteristics of the memory die. Such methods can further include performing the select gate scan operation by applying signaling having the altered threshold voltage to a select gate of the memory die.

19 Claims, 7 Drawing Sheets

(51) Int. Cl.
*G11C 29/00* (2006.01)
*G11C 29/04* (2006.01)

(58) Field of Classification Search
CPC .... G11C 2029/0403; G11C 2029/5004; G11C 16/0483; G11C 16/08; G11C 16/349
See application file for complete search history.

(56) References Cited

U.S. PATENT DOCUMENTS

| | | |
|---|---|---|
| 2014/0231954 A1 | 8/2014 | Lue |
| 2016/0179386 A1 | 6/2016 | Zhang |
| 2019/0279959 A1* | 9/2019 | Hiemstra ................ H01L 24/17 |
| 2020/0105353 A1* | 4/2020 | Sharon ................. G11C 29/021 |
| 2020/0310521 A1* | 10/2020 | Badrieh .............. G11C 11/2297 |
| 2021/0303211 A1* | 9/2021 | Moon ................... G06F 3/0679 |
| 2022/0293198 A1* | 9/2022 | Sakakibara ............ G11C 16/24 |
| 2023/0094273 A1* | 3/2023 | Lee ................. G11C 29/12005 |
| | | 365/201 |

* cited by examiner

DYNAMIC PRIORITIZATION OF SELECTOR $V_T$ SCANS

PRIORITY INFORMATION

This application claims benefit of U.S. Provisional Application Ser. No. 63/291,206, filed on Dec. 17, 2021, the contents of which are incorporated herein by reference.

TECHNICAL FIELD

Embodiments of the disclosure relate generally to memory sub-systems, and more specifically, relate to select gate scan operations.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
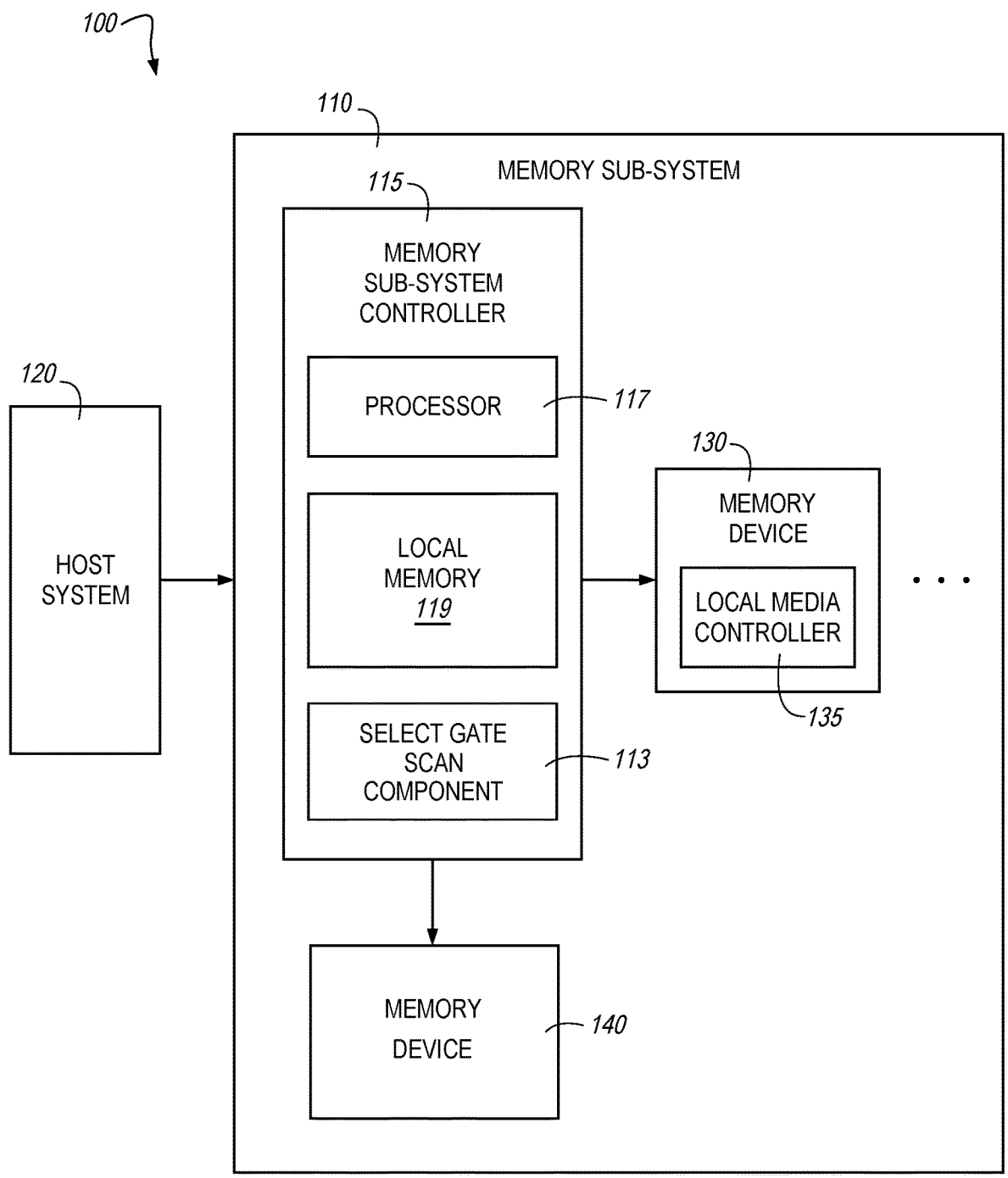
FIG. 1 illustrates an example computing system that includes a memory sub-system in accordance with some embodiments of the present disclosure.

Aspects of the present disclosure are directed to select gate scan operations in a memory sub-system, in particular to memory sub-systems that include circuitry to perform select gate scan operations. A memory sub-system can be a storage system, storage device, a memory module, or a combination of such. An example of a memory sub-system is a storage system such as a solid-state drive (SSD). Examples of storage devices and memory modules are described below in conjunction with FIG. 1, et alibi. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. One example of non-volatile memory devices is a NOT-AND (NAND) memory device (also known as flash technology). Other examples of non-volatile memory devices are described below in conjunction with FIG. 1. A non-volatile memory device is a package of one or more dice. Each die can consist of one or more planes. Planes can be groups into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information. A block hereinafter refers to a unit of the memory device used to store data and can include a group of memory cells, a word line group, a word line, or individual memory cells. For some memory devices, blocks (also hereinafter referred to as "memory blocks") are the smallest area than can be erased. Pages cannot be erased individually, and only whole blocks can be erased.

Each of the memory devices can include one or more arrays of memory cells. Depending on the cell type, a cell can store one or more bits of binary information, and has various logic states that correlate to the number of bits being stored. The logic states can be represented by binary values, such as "0" and "1", or combinations of such values. There are various types of cells, such as single level cells (SLCs), multi-level cells (MLCs), triple level cells (TLCs), and quad-level cells (QLCs). For example, a SLC can store one bit of information and has two logic states.

Some NAND memory devices employ a floating-gate architecture in which memory accesses are controlled based on a relative voltage change between the bit line and the word lines. Other examples of NAND memory devices can employ a replacement-gate architecture that can include the use of word line layouts that can allow for charges corresponding to data values to be trapped within memory cells based on properties of the materials used to construct the word lines. While both floating-gate architectures and replacement-gate architectures employ the use of select gates (e.g., select gate transistors), replacement-gate architectures can include multiple select gates coupled to a string of NAND memory cells. Further, replacement-gate architectures can include programmable select gates, which can be programmed to a particular threshold voltage ($V_T$) level during operation of a NAND memory device.

Because the select gates of replacement-gate NAND architectures can be programmed (e.g., can be biased to a logic HIGH or logic LOW state, or states in between), such select gates can be susceptible to shifting or "drifting" of the voltage corresponding to the state programmed to the select gates. For example, the threshold voltage ($V_T$) distribution of the select gates of replacement-gate NAND architectures can shift or "drift" during operation of the NAND memory device. That is, the $V_T$ of the select gates of replacement-gate architectures can change over time such that the actual $V_T$ distribution corresponding to the select gates is different than the expected $V_T$ distribution corresponding to the select gates. One reason for this phenomenon is that programmable select gates can experience physical degradation as a result of being programmed, which can result in charge loss or charge gain over time (e.g., over the lifetime of a NAND device that employs a replacement-gate architecture) by the select gates.

Some approaches attempt to mitigate the effects of charge loss, charge gain, and/or other voltage drift phenomenon experienced by programmable select gates over time by periodically performing a select gate scan and select gate erase/re-program or select gate touch-up (program without erase) operation in which the $V_T$ distribution of the select gates is reset to the expected $V_T$ distribution. However, such approaches perform such select gate scan operations on all of the select gates of an entire memory die or of all the memory dice of a memory device or memory sub-system without regard for characteristics of the memory dice. While such approaches can correct the effects of charge loss, charge gain, and/or other voltage drift phenomenon experienced by programmable select gates over time, at due to the static nature of select gate scan operations in such approaches, variations across all the memory dice and/or memory blocks of a memory device or memory sub-system may not effectively be captured. By failing to account for these and other real-life characteristics of memory dice, such approaches can lead to the need for deep error recovery flows to be invoked in order to correct the effects of charge loss, charge gain, and/or other voltage drift phenomenon experienced by programmable select gates over time, which can give rise to an increase in latency experienced by the memory device and/or memory sub-system and therefore a decrease in quality of service (QoS) provided by the memory device and/or memory sub-system.

Aspects of the present disclosure address the above and other deficiencies by allowing for select gate scan operations to be performed on particular select gates of a memory device or memory sub-system in the absence of performing such select gate scan operations on all of the select gates of an entire memory die or of all the memory dice of a memory device or memory sub-system. As described in more detail, herein, embodiments of the present disclosure allow for characteristics (e.g., quality characteristics) of memory dice in a memory device or memory sub-system to be determined and/or ranked as part of performance of select gate scan operations. As used herein, the term "quality characteristics," and variants thereof, generally refer to quantifiable attributes of a memory die, and/or the constituent components thereof, that affect the performance of the memory die and, therefore, the memory device or memory sub-system in which the memory die is deployed. Non-limiting examples of quality characteristics can include a fuse_ID (described below); a quantity of program-erase cycles (PEC) that memory cells of the memory die have undergone; operating temperatures that the memory die has been subjected to; physical age, (e.g., the number of months or years a device has been in the field, independent of PEC); workload, which can be measured by a quantity of read, write, and/or erase operations; disturb effects; charge loss, charge gain, and/or other voltage drift phenomenon experienced by programmable select gates of the memory die; and the presence of other errors in a memory device and/or memory sub-system.

As described herein, quality characteristics of the memory dice can be determined based on a relative location on a wafer at which the memory dice were fabricated. The relative locations on the wafer at which the memory dice were fabricated can be referred to as a "fuse_ID." As an example, because manufacturing process variation can lead to memory dice that are fabricated at the edge of the wafer having generally lower quality characteristics than those memory dice that are fabricated closer to the center of the wafer (or, vice-versa), embodiments herein allow for the relative location of the memory dice with respect to the wafer during fabrication (e.g., the respective fuse_IDs of the memory dice) to be used in connection with determining which memory dice may be susceptible to degradation as compared to other memory dice to determine a frequency at which to perform select gate scan operations and/or a voltage to be used in performing select gate scan operations. For example, embodiments herein can allow for select gate scan operations to be performed more frequently (and/or to utilize higher scanning voltages) on memory dice that were fabricated closer to the edge of the wafer than memory dice that were fabricated closer to the center of the wafer.

In some embodiments, quality characteristics of select gates of the memory dice can be determined by modulating scan voltages to determine behavior of a tail region of the $V_T$ distribution of the select gates. For example, embodiments herein can allow for a one check failure byte (CFBYTE) scheme to be modulated such that information regarding the slope of the select gate $V_T$ distribution can be determined. In addition to, or in the alternative, embodiments herein can allow for a read level associated with the select gates to be modulated such that insight into the dynamics of the tail region of the select gate $V_T$ distribution can be determined. This is in contrast to approaches in which select gate maintenance operations can be performed using a static read level and/or a static CFBYTE scheme. However, by allowing for the CFBYTE scheme and/or the read level to be modulated (e.g., applied at various voltage increments, etc.), insight into the tail region of the select gate $V_T$ distribution can be determined and used in the performance and/or prioritization of select gate scan operations. For example, because characteristics of the tail region of the select gate $V_T$ distribution can be indicative of degradation of the select gates and/or the memory dice, by modulating voltages associated with a CFBYTE scheme and/or by modulating read level voltages and monitoring the behavior of the tail region of the select gate $V_T$ distribution, select gate scan operations can be prioritized or deprioritized for memory dice to reduce latency associated with the memory device and to increase QoS of the memory device.

By selectively controlling performance of select gate scan operations, as described herein, latency of the memory device and hence, a memory sub-system in which the memory device is deployed, can be reduced in comparison to approaches that perform select gate scan operations on select gates regardless of the quality characteristics of the memory dice and/or select gates. This reduction in latency can allow for QoS to be improved for the memory device and the memory sub-system.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD).

Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random access memory (SDRAM).

Some examples of non-volatile memory devices (e.g., memory device 130) include NOT-AND (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can include a select gate scan component 113. Although not shown in FIG. 1 so as to not obfuscate the drawings, the select gate component 113 can include various circuitry to facilitate performance of select gate scan operations. As described in more detail, herein, the select gate scan operations can be performed dynamically and/or adaptively on the select gates of individual memory dice based on quality characteristics of the memory dice and/or select gates. By selectively controlling performance of select gate scan operations, latency of the memory sub-system 110 can be reduced in comparison to approaches that perform select gate scan operations on select gates regardless of the quality characteristics of the memory dice and/or select gates, thereby improving QoS for the memory sub-system 110. In some embodiments, the select gate scan component 113 can include special purpose circuitry in the form of an ASIC, FPGA, state machine, and/or other logic circuitry that can allow the select gate scan component 113 to orchestrate and/or perform operations described herein involving the memory device 130 and/or the memory device 140.

In some embodiments, the memory sub-system controller 115 includes at least a portion of the select gate scan component 113. For example, the memory sub-system controller 115 can include a processor 117 (processing device) configured to execute instructions stored in local memory 119 for performing the operations described herein. In some embodiments, the select gate scan component 113 is part of the host system 110, an application, or an operating system.

In some embodiments, the memory sub-system 110, and hence the select gate scan component 113, the processor 119, and the memory devices 130/140, can be resident on a mobile computing device such as a smartphone, laptop, or phablet among other similar computing devices. As used herein, the term "mobile computing device" generally refers to a handheld computing device that has a slate or phablet form factor. In general, a slate form factor can include a display screen that is between approximately 3 inches and 5.2 inches (measured diagonally), while a phablet form factor can include a display screen that is between approximately 5.2 inches and 7 inches (measured diagonally). Examples of "mobile computing devices" are not so limited, however, and in some embodiments, a "mobile computing device" can refer to an IoT device or any other type of edge computing device(s).

Further, the select gate scan component 113 can be resident on the memory sub-system 110. As used herein, the term "resident on" refers to something that is physically located on a particular component. For example, the select gate scan component 113 being "resident on" the memory sub-system 110 refers to a condition in which the hardware circuitry that comprises the select gate scan component 113 is physically located on the memory sub-system 110. The term "resident on" can be used interchangeably with other terms such as "deployed on" or "located on," herein.

Figure 2:
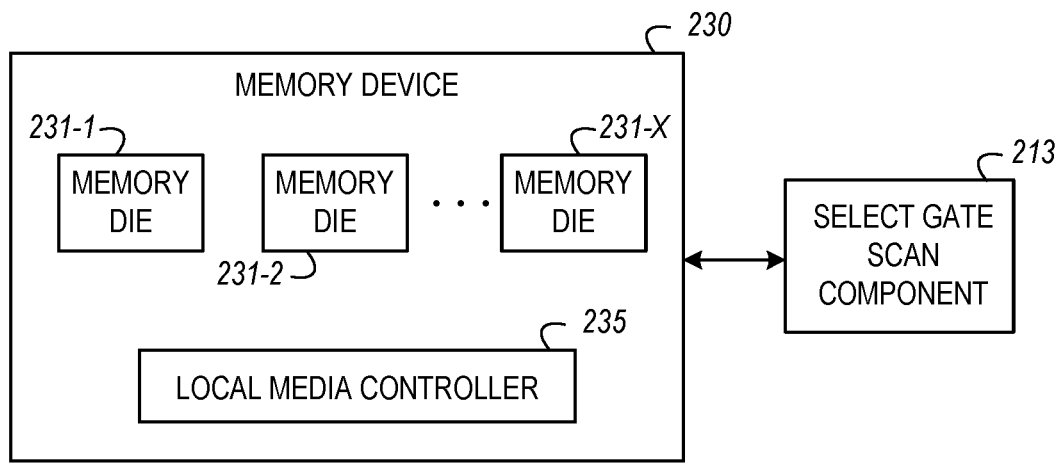
FIG. 2 illustrates an example of a memory device that includes multiple memory dice in accordance with some embodiments of the present disclosure.

FIG. 2 illustrates an example of a memory device 230 that includes multiple memory dice 231-1 to 231-X in accordance with some embodiments of the present disclosure. The memory device 230 can be analogous to the memory device 130 illustrated in FIG. 1, herein. As shown in FIG. 2, the memory device 230 can include multiple memory dice, such as the memory die 231-1, the memory die 231-2, up to the memory die 230-X, as well as a local media controller 235, which can be analogous to the local media controller 135 illustrated in FIG. 1. Further, as shown in FIG. 2, the memory device 230 is coupled to a select gate scan component 213, which can be analogous to the select gate scan component 113 illustrated in FIG. 1, herein.

In some embodiments, the memory dice 231-1 to 231-X are flash NAND memory dice. For example, each of the memory dice 231-1 to 231-X can include one or more arrays of memory cells (not shown so as to not obfuscate the drawing) such as single level cells (SLCs) or multi-level cells (MLCs) (e.g., triple level cells (TLCs) or quad-level cells (QLCs)). In some embodiments, a particular memory die 231-1 to 231-X can include an SLC portion, and an MLC portion, a TLC portion, and/or a QLC portion of memory cells. Each of the memory cells can store one or more bits of data used by the host system (e.g., the host system 120 illustrated in FIG. 1, herein). Furthermore, the memory cells of the memory dice 231-1 to 231-X can be grouped as memory pages or memory blocks that can refer to units of the memory dice 231-1 to 231-X that are used to store data.

Figure 3:
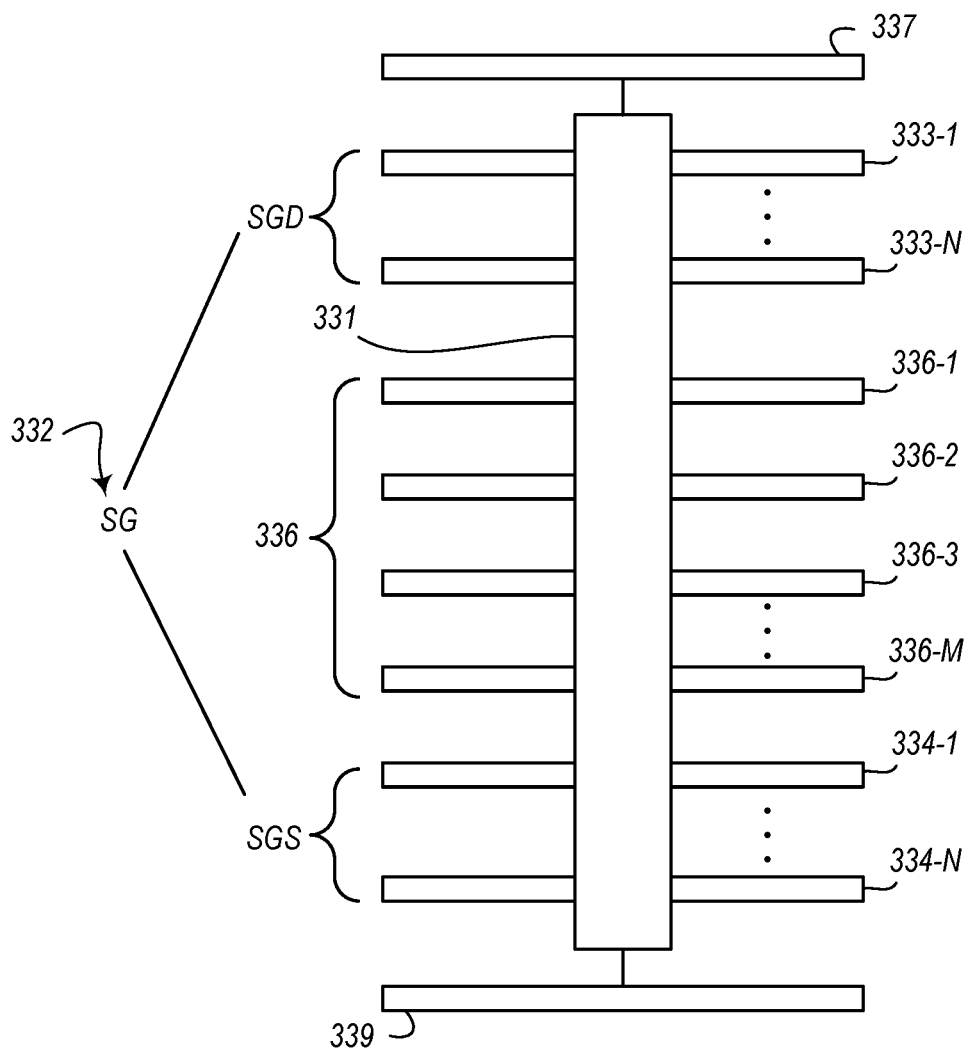
FIG. 3 illustrates an example cross-sectional view of a portion of a memory die that includes a string of memory cells coupled to select gates and word lines in accordance with some embodiments of the present disclosure.

FIG. 3 illustrates an example cross-sectional view of a portion of a memory die (e.g., one of the memory dice 231-1 to 231-X illustrated in FIG. 2) that includes a string of memory cells 331 coupled to select gates (SG) 332 and word lines 336 in accordance with some embodiments of the present disclosure. As shown in FIG. 3, the string of memory cells 331 is further coupled to a bit line 337 and a source line 339. So as to not obfuscate the drawings, individual memory cells corresponding to the strings of memory cells 331 are not shown; however, it will be appreciated by one of ordinary skill in the art that the string of memory cells 331 includes multiple memory cells that are coupled to respective word lines 336 among the word lines 336-1, 336-2, 336- to 336-M illustrated in FIG. 3. The select gates (SG) 332 comprise a drain region (SGD) 331-1 to 331-N and can be referred to in the alternative as "upper select gates," herein. In addition, the select gates (SG) 332 comprise a source region (SGS) 334-1 to 334-N and can be referred to in the alternative as "lower select gates," herein.

As described herein, a select gate scan component (e.g., the select gate scan component 213 illustrated in FIG. 2) can control performance of scan operations that involve the select gates (SG) 332. For example, a processor (e.g., the select gate scan component 213 illustrated in FIG. 2) can determine quality characteristics of a memory die (e.g., one of the memory dice 231-1 to 231-X illustrated in FIG. 2) and, based on the determined quality characteristics, can selectively control performance of select gate scan operations such that a select gate scan operation is performed involving a select gate (SG) 332 that is resident on at least one, but necessarily all of the memory dice.

In a non-limiting example, an apparatus includes a memory die (e.g., one or more of the memory dice 231-1 to 231-X illustrated in FIG. 2) resident on a memory device (e.g., the memory device 230 illustrated in FIG. 2). A select gate (SG) 332 is coupled to at least one string 331 of memory cells of the memory die. A processor (e.g., the select gate scan component 213 illustrated in FIG. 2) coupled to the memory device and is configured to determine quality characteristics of the memory die and alter signaling applied to the select gate (SG) 332 in performance of a select gate scan operation based, at least in part, on the determined quality characteristics of the memory die. The processor can further perform the select gate operation using the altered signaling.

In some embodiments, the altered signaling can include signaling having an altered threshold voltage corresponding thereto. For example, the processor can alter the signaling applied in performance of the select gate scan operation such that a magnitude of a voltage applied to the select gate (SG) 332 is greater than or less than a magnitude of the voltage applied to the select gate (SG) 332 in at least one previous select gate scan operation and/or in performance of a conventional select gate scan operation in which the select gates of every memory die receive a same threshold voltage signal. By altering the threshold voltage of the signaling applied in performance of the select gate scan operation, charge loss, charge gain, and/or other voltage distribution drift effects experienced by the select gate (SG) 332 can be remedied.

Embodiments are not so limited, however, and in some embodiments, the signaling can be altered such that the select gate scan operation is performed a greater frequency or a lesser frequency than prior to the signaling being altered. For example, the processor can alter the signaling applied in performance of the select gate scan operation such that the signaling is applied less frequently (e.g., the select gate scan operation is performed less frequently) on select gates and, hence, memory dice that exhibit relatively higher quality characteristics than other memory dice of the memory device. Conversely, the processor can alter the signaling applied in performance of the select gate scan operation such that the signaling is applied more frequently (e.g., the select gate scan operation is performed more frequently) on select gates and, hence, memory dice that exhibit relatively lower quality characteristics than other memory dice of the memory device.

As described in more detail herein, the quality characteristics can be based, at least in part, on a physical location of a wafer (e.g., the wafer 790 illustrated in FIG. 7) at which the memory die was fabricated. Accordingly, in some embodiments, the quality characteristics can be based, at least in part, on doping profile variations associated with the memory die as a result of memory die fabrication processes.

As described in more detail in connection with FIG. 4 and FIG. 5, herein, in some embodiments the processor can be configured to determine a slope of a portion of a voltage threshold exhibited by the select gate (SG) 332 during operation of the memory device and alter the signaling applied to the select gate (SG) 332 in performance of the select gate scan operation based, at least in part, on the determined slope of the portion of the voltage threshold exhibited by the select gate (SG) 332 during operation of the memory device. In addition to, or in the alternative, the processor can be configured to determine a quantity of bit failures exhibited by the select gate (SG) 332 during operation of the memory device and alter the signaling applied to the select gate in performance of the select gate scan operation based, at least in part, on the determined quantity of bit failures exhibited by the select gate (SG) 332 during operation of the memory device.

In another non-limiting example, a system (e.g., the computing system 100 illustrated in FIG. 1) can include a plurality memory dice (e.g., the memory dice 231 illustrated in FIG. 2) that are resident on a memory device (e.g., the memory device 230 illustrated in FIG. 2). The system can include select gates (SG) 332 coupled to respective strings of memory cells 331 of respective memory dice of the plurality of memory dice. The system can further include a processor (e.g., the select gate scan component 213 illustrated in FIG. 2) coupled to the plurality of memory dice. The processor can perform operations to determine quality characteristics of each memory die of the plurality of memory dice. As described herein, the quality characteristics can be based, at least in part, on a physical location of a wafer (e.g., the wafer 790 illustrated in FIG. 7) at which each memory die was fabricated. The processor can further perform operations to assign a ranking value to each memory die of the plurality of memory dice based on the determined quality characteristics of each memory die. In some embodiments, the ranking value is based on the quality characteristics of the memory dice. For example, memory dice that have relatively high or "good" quality characteristics (e.g., memory dice that are fabricated near the center area 791 of the wafer 790, memory dice that have not been determined to be degrading, and/or memory dice that perform well during the modulation operations discussed in connection with FIG. 4 and FIG. 5, etc.) can be assigned a higher ranking value than memory dice that have relatively low or "poor" quality characteristics (e.g., memory dice that are fabricated near the edge area 792 of the wafer 790, memory dice that have been determined to be degrading, and/or memory dice that perform poorly during the modulation operations discussed in connection with FIG. 4 and FIG. 5, etc.) can be assigned a lower ranking value.

The processor can perform operations to alter parameters associated with signaling indicative of a select gate scan operation involving at least one of the respective select gates based, at least in part, on the assigned ranking values and cause (e.g., control via generation of signaling and/or commands) performance of the select gate scan operation involving the at least one of the respective select gates using the altered parameters associated with the signaling indicative of the select gate scan operation involving at least one of the respective select gates. In some embodiments, the processor can perform operations to alter the parameters associated with the signaling indicative of the select gate scan operation by altering a frequency at which the select gate scan operation is performed involving at least one of the respective select gates. Embodiments are not so limited, however, and in some embodiments, the processor can perform operations to alter the parameters associated with the signaling indicative of the select gate scan operation by altering a voltage threshold applied to at least one of the respective select gates during performance of the select gate scan operation.

Continuing with this non-limiting example, the processor can perform operations to monitor a slope associated with a portion of a voltage distribution associated with a voltage threshold of at least one of the respective select gates, as described in more detail in connection with FIG. 4 and FIG. 5. In such examples, the processor can further perform operations to alter the parameters associated with the signaling indicative of the select gate scan operation involving at least one of the respective select gates based on the monitored slope of the portion of the voltage distribution associated with the voltage threshold of at least one of the respective select gates.

In some embodiments, the processor can perform operations to monitor a quantity of bit failures detected in a particular time period for at least one of the respective select gates as described in more detail in connection with FIG. 4 and FIG. 5. In such examples, the processor can further perform operations to alter the parameters associated with the signaling indicative of the select gate scan operation involving at least one of the respective select gates based on the monitored quantity of bit failures detected in the particular time period for at least one of the respective select gates.

Figure 4:
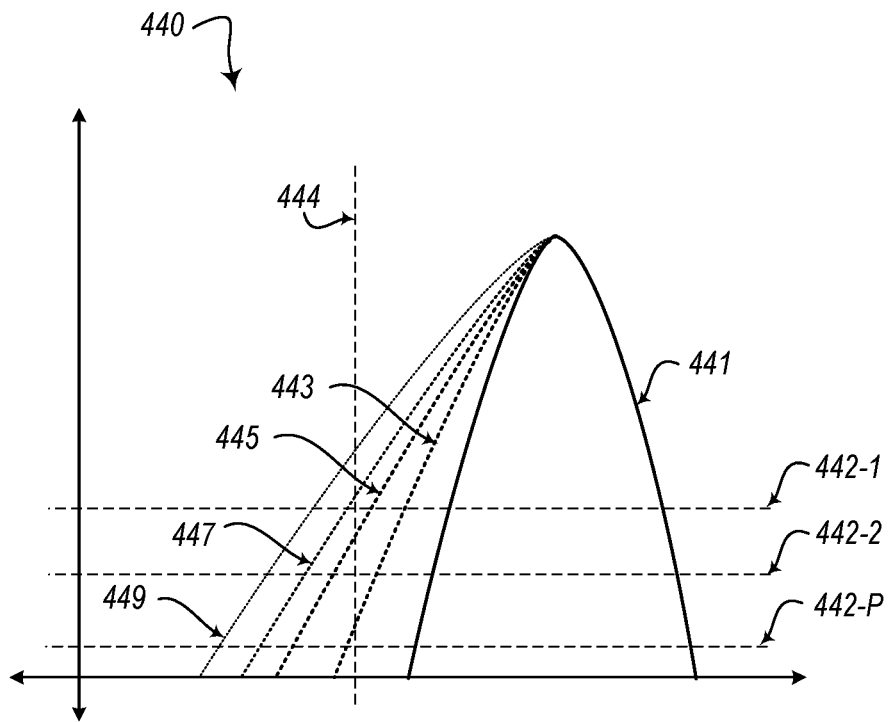
FIG. 4 illustrates an example of a threshold voltage ($V_T$) distribution plot for a select gate in accordance with some embodiments of the present disclosure.

FIG. 4 illustrates an example of a threshold voltage ($V_T$) distribution plot 440 for a select gate (e.g., at least one of the select gates (SG) 332 illustrated in FIG. 3, herein) in accordance with some embodiments of the present disclosure. In FIG. 4, the threshold voltage ($V_T$) distribution plot 440 shows an expected $V_T$ distribution 441 of the select gates of a memory die (e.g., one or more of the memory dice 231-1 to 231-X illustrated in FIG. 2). However, as described above, the $V_T$ distribution of the select gates can shift over time due to charge loss, charge gain, and/or other voltage drift phenomena inherent in the select gate and/or in the memory die in which the select gate is deployed. Such charge loss, charge gain, and/or other voltage drift phenomena can be exacerbated based on the quality characteristics of the memory die in which the select gate is deployed.

The curves 443, 445, 447, and 449 can represent voltage drifts that can occur at the "tail" end of the $V_T$ distribution 441 of at least one of the select gates (e.g., at portion of the $V_T$ distribution 441 of at least one of the select gates that has drifted to a lower threshold voltage potential) as a result of charge loss and/or other voltage drift phenomena inherent in the select gate and/or in the memory die in which the select gate is deployed. In general, when at least one of the select gates of the "tail" end of the $V_T$ distribution has drifted to a lower threshold voltage potential, a select gate scan operation to "touch-up" the select gate(s) is performed to correct the $V_T$ distribution of the select gate(s), as described herein. In some embodiments, the select gate "touch-up" operation is performed in the absence of performance of an erase operation involving the select gate(s).

Although shown in FIG. 4 as a "tail" end of the $V_T$ distribution 441 of a particular select gate, embodiments are not so limited and examples in which the curves 443, 445, 447, and 449 can represent a "head" of the $V_T$ distribution 441 of a particular select gate (e.g., embodiments in which the curves 443, 445, 447, and 449 are reflected upon a vertical axis with respect to the layout of FIG. 4) are contemplated within the disclosure as well. In such embodiments, the "head" end of the $V_T$ distribution 441 of at least one of the select gates (e.g., at portion of the $V_T$ distribution 441 of at least one of the select gates that has drifted to a higher threshold voltage potential) as a result of charge gain and/or other voltage drift phenomena inherent in the select gate and/or in the memory die in which the select gate is deployed. In general, when at least one of the select gates of the "head" end of the $V_T$ distribution has drifted to a higher threshold voltage potential, the select gate(s) can be erased and reprogrammed.

As shown in FIG. 4, a one check fail byte scheme (a CFBYTE scheme) can be modulated such that slopes of the tail ends (e.g., the curves 443, 445, 447, and 449) of the $V_T$ distribution 441 of at least one of the select gates can be determined as part of determining when to perform select gate scan operations. As used herein, a "one check fail byte scheme" or "CFBYTE scheme" generally refers to schemes in which the number of failed bytes on cells or programmable select gates targeted at a specific level in programming the memory cells are counted to determine behavior of the cells or the programmable select gates. As an example, CFBYTE and its process can provide a method to count or check the number of fail bytes for a particular level, such that a microcontroller inside a memory device component being programmed can track the progress of the program algorithm and determine eventually the pass/fail status of the program of the memory device. For example, a CFBYTE scheme can be applied to a programmable select gate such that behavior of the $V_T$ distribution 441 can be monitored using a first CFBYTE scheme 442-1, a second CFBYTE scheme 442-2, and/or a $P^{th}$ CFBYTE scheme 442-P.

In some embodiments, the CFBYTE scheme is modulated between the CFBYTE schemes 442-1, 442-2 to 442-P at a particular read voltage 444. By keeping the read voltage 444 constant, the slope of the "tail" ends 443, 445, 447, and 449 of the $V_T$ distribution 441 can be determined based on the CFBYTE schemes 442-1, 442-2 to 442-P. Based on the slope of the "tail" ends 443, 445, 447, and 449 of the $V_T$ distribution 441 quality characteristics of the select gate corresponding to the threshold voltage ($V_T$) distribution plot 440 can be determined.

For example, based on the slope of the "tail" ends 443, 445, 447, and 449 of the $V_T$ distribution 441, it can be determined (by, for example, a processor) that the select gate corresponding to the threshold voltage ($V_T$) distribution plot 440 and hence, the memory die in which the select gate is deployed, whether the select gate and/or memory die in which the select gate is deployed is degrading (or will degrade) at a faster rate than other select gates and/or memory dice of a memory device. If it is determined that the select gate corresponding to the threshold voltage ($V_T$) distribution plot 440 and hence, the memory die in which the select gate is deployed is degrading (or will degrade) at a faster rate than other select gates and/or memory dice of a memory device, the processor can alter signaling applied to the select gate as part of performance of a select gate scan operation by altering the voltage (e.g., increasing the applied voltage of the select gate scan) of the signaling and/or applying the signaling more frequently to the select gate that is degrading and/or will degrade at a faster rate than the other select gates and/or memory dice of the memory device. Conversely, if it is determined that the select gate corresponding to the threshold voltage ($V_T$) distribution plot 440 and hence, the memory die in which the select gate is deployed is degrading (or will degrade) at a slower rate than other select gates and/or memory dice of a memory device, the processor can dynamically alter signaling applied to the select gate as part of performance of a select gate scan operation by applying the signaling less frequently to the select gate that is degrading and/or will degrade at a slower rate than the other select gates and/or memory dice of the memory device.

Figure 5:
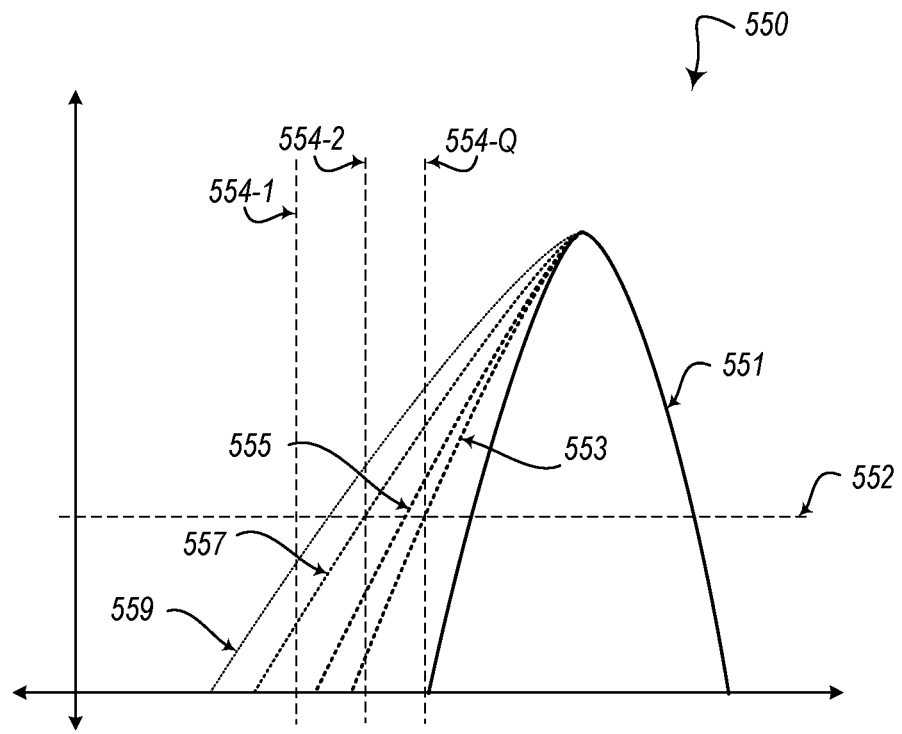
FIG. 5 illustrates another example of a threshold voltage ($V_T$) distribution plot for a select gate in accordance with some embodiments of the present disclosure.

FIG. 5 illustrates another example of a threshold voltage ($V_T$) distribution plot 550 for a select gate (e.g., at least one of the select gates (SG) 332 illustrated in FIG. 3, herein) in accordance with some embodiments of the present disclosure. In FIG. 5, the threshold voltage ($V_T$) distribution plot 550 shows an expected $V_T$ distribution 551 of the select gates of a memory die (e.g., one or more of the memory dice 231-1 to 231-X illustrated in FIG. 2). However, as described above, the $V_T$ distribution of the select gates can shift over time due to charge loss, charge gain, and/or other voltage drift phenomena inherent in the select gate and/or in the memory die in which the select gate is deployed. Such charge loss, charge gain, and/or other voltage drift phenomena can be exacerbated based on the quality characteristics of the memory die in which the select gate is deployed.

The curves 553, 555, 557, and 559 can represent voltage drifts that can occur at the "tail" end of the $V_T$ distribution 551 of at least one of the select gates (e.g., at portion of the $V_T$ distribution 551 of at least one of the select gates that has drifted to a lower threshold voltage potential) as a result of charge loss, and/or other voltage drift phenomena inherent in the select gate and/or in the memory die in which the select gate is deployed. Although shown in FIG. 5 as a "tail" end of the $V_T$ distribution 551 of a particular select gate, embodiments are not so limited and examples in which the curves 553, 555, 557, and 559 can represent a "head" of the $V_T$ distribution 551 of a particular select gate (e.g., embodiments in which the curves 553, 555, 557, and 559 are reflected upon a vertical axis with respect to the layout of FIG. 5) are contemplated within the disclosure as well.

Although shown in FIG. 5 as a "tail" end of the $V_T$ distribution 551 of a particular select gate, embodiments are not so limited and examples in which the curves 553, 555, 557, and 559 can represent a "head" of the $V_T$ distribution 551 of a particular select gate (e.g., embodiments in which the curves 553, 555, 557, and 559 are reflected upon a vertical axis with respect to the layout of FIG. 5) are contemplated within the disclosure as well. In such embodiments, the "head" end of the $V_T$ distribution 551 of at least one of the select gates (e.g., at portion of the $V_T$ distribution 441 of at least one of the select gates that has drifted to a higher threshold voltage potential) as a result of charge gain and/or other voltage drift phenomena inherent in the select gate and/or in the memory die in which the select gate is deployed. In general, when at least one of the select gates of the "head" end of the $V_T$ distribution has drifted to a higher threshold voltage potential, the select gate(s) can be erased and reprogrammed.

As shown in FIG. 5, a read level can be modulated such that slopes of the tail ends (e.g., the curves 553, 555, 557, and 559) of the $V_T$ distribution 551 of at least one of the select gates can be determined as part of determining when to perform select gate scan operations. As used herein, a "read level" generally refers to a specific voltage level that is applied to cells and/or programmable select gates to retrieve information associated with the cells and/or programmable select gates. For example, a signal indicative of a read level (e.g., a specific voltage associated with a read operation) can be applied to a programmable select gate such that behavior of the $V_T$ distribution 551 can be monitored at a first read level 554-1, a second read level 554-2 and/or a $Q^{th}$ read level 554-Q.

In some embodiments, the read level is modulated between the read levels 554-1, 554-2 to 554-Q quantity of detected failed bits 552. By keeping the quantity of failed bits 552 constant, the slope of the "tail" ends 553, 555, 557, and 559 of the $V_T$ distribution 551 can be determined based on the read levels 554-1, 554-2 to 554-Q. Based on the slope of the "tail" ends 553, 555, 557, and 559 of the $V_T$ distribution 551 quality characteristics of the select gate corresponding to the threshold voltage ($V_T$) distribution plot 550 can be determined.

For example, based on the slope of the "tail" ends 553, 555, 557, and 559 of the $V_T$ distribution 551, it can be determined (by, for example, a processor) that the select gate corresponding to the threshold voltage ($V_T$) distribution plot 550 and hence, the memory die in which the select gate is deployed, whether the select gate and/or memory die in which the select gate is deployed is degrading (or will degrade) at a faster rate than other select gates and/or memory dice of a memory device. If it is determined that the select gate corresponding to the threshold voltage ($V_T$) distribution plot 550 and hence, the memory die in which the select gate is deployed is degrading (or will degrade) at a faster rate than other select gates and/or memory dice of a memory device, the processor can alter signaling applied to the select gate as part of performance of a select gate scan operation by altering the voltage (e.g., increasing the applied voltage of the select gate scan) of the signaling and/or applying the signaling more frequently to the select gate that is degrading and/or will degrade at a faster rate than the other select gates and/or memory dice of the memory device. Conversely, if it is determined that the select gate corresponding to the threshold voltage ($V_T$) distribution plot 550 and hence, the memory die in which the select gate is deployed is degrading (or will degrade) at a slower rate than other select gates and/or memory dice of a memory device, the processor can alter signaling applied to the select gate as part of performance of a select gate scan operation by altering the voltage (e.g., decreasing the applied voltage of the select gate scan) of the signaling and/or applying the signaling less frequently to the select gate that is degrading and/or will degrade at a slower rate than the other select gates and/or memory dice of the memory device.

Figures 1, 6:
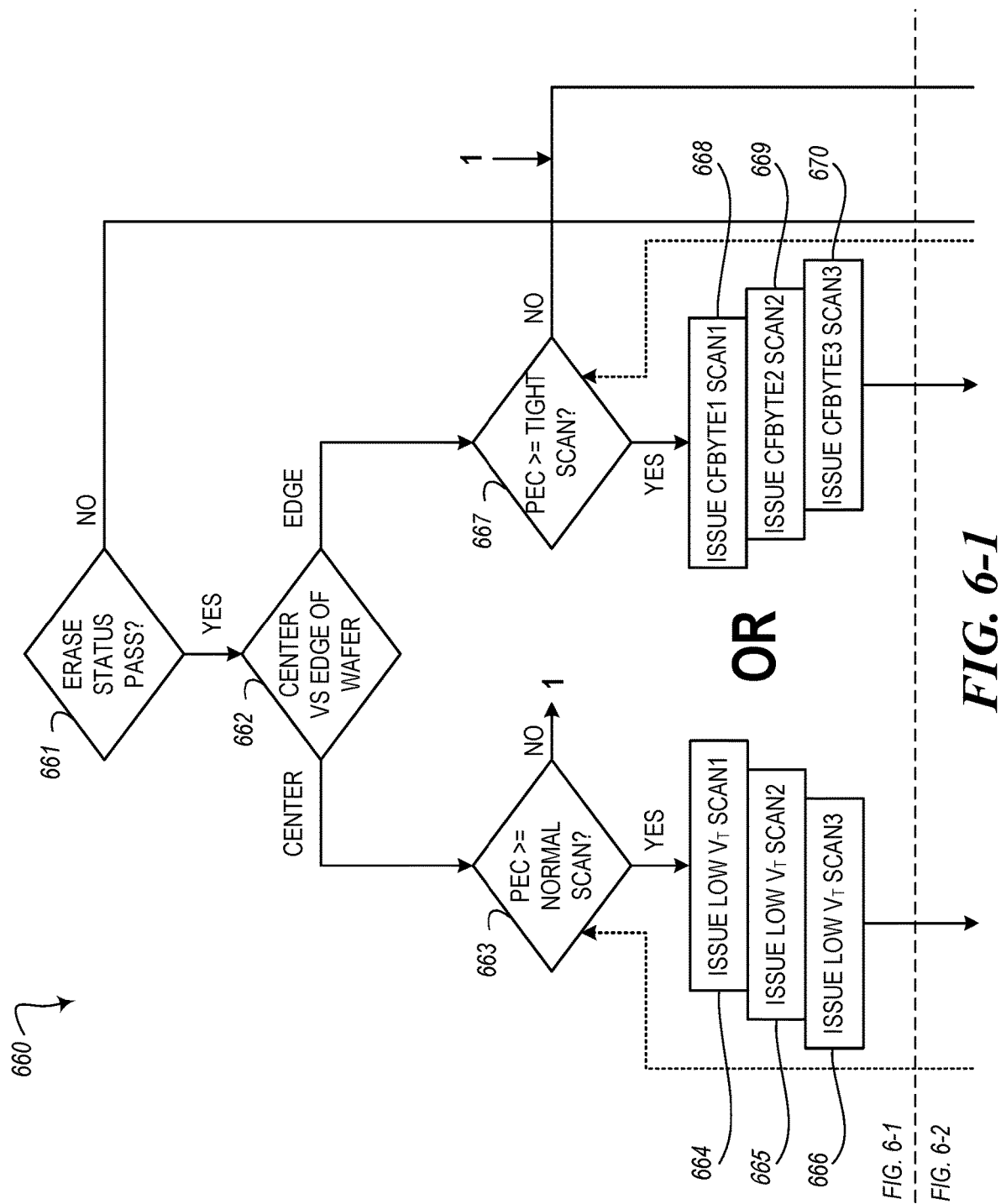
FIG. 6 (i.e., FIG. 6-1 and FIG. 6-2) illustrates an example flow diagram corresponding to select gate scan operations in accordance with some embodiments of the present disclosure.
Figures 2, 6:
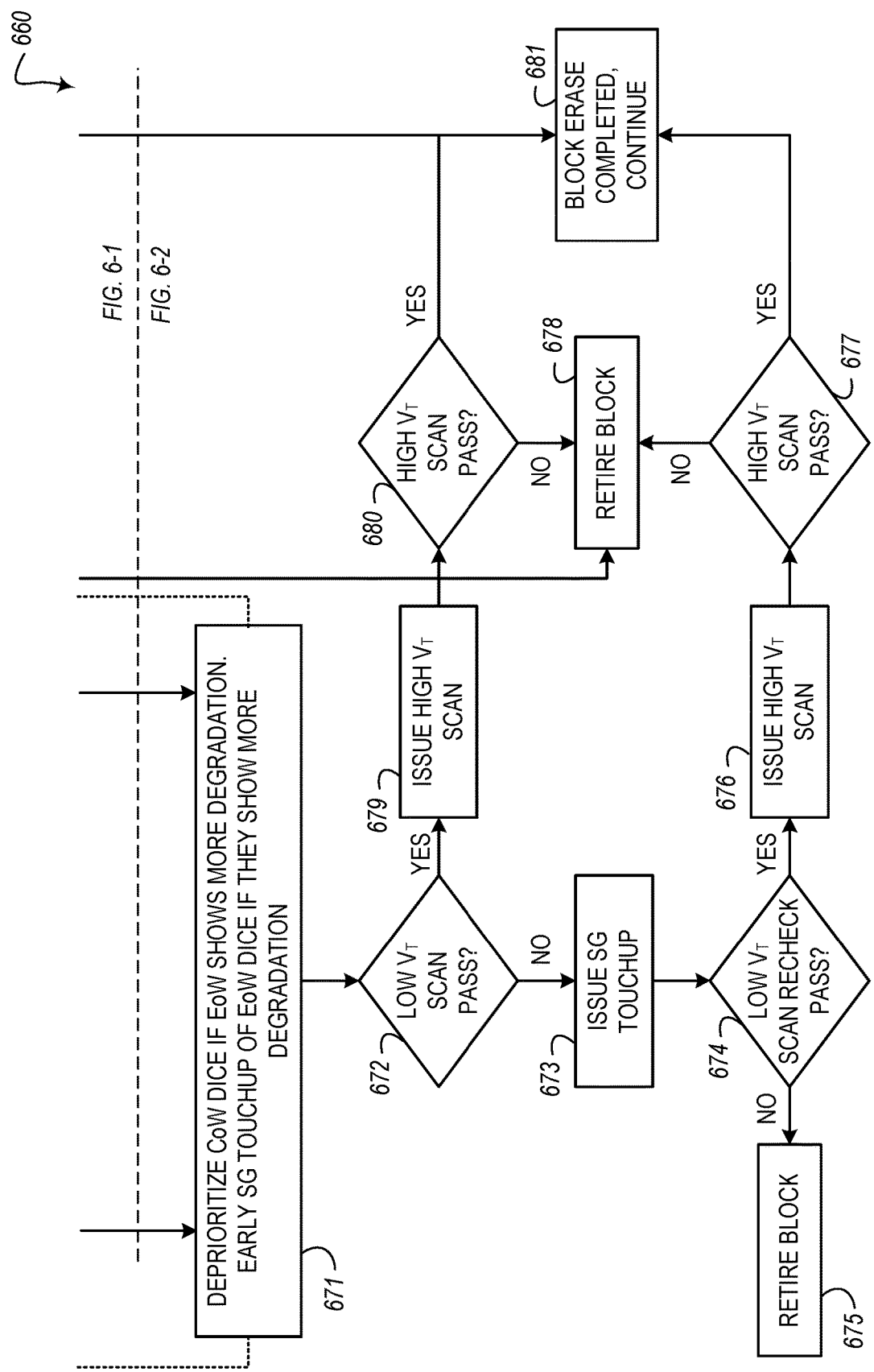

FIG. 6 illustrates an example flow diagram 660 corresponding to select gate scan operations in accordance with some embodiments of the present disclosure. It is noted that FIG. 6 is presented across two pages. A page that includes FIG. 6-1 and a page that includes FIG. 6-2. In general, FIG. 6 is described in terms of the entire illustration of FIG. 6 (i.e., FIG. 6-1 and FIG. 6-2, collectively); however, FIG. 6-1 and/or FIG. 6-2 may be at times referenced individually in order to elucidate aspects of the present disclosure.

In some embodiments, the flow 660 can be initiated by a block erase command issued to a memory die (e.g., at least one memory die 231-1 to 231-X illustrated in FIG. 3) by a processor (e.g., the select gate scan component 113 illustrated in FIG. 1) that is resident on a memory device (e.g., the memory device 130 illustrated in FIG. 1). The block erase command can include instructions to perform an operation to delete data stored in a particular block of the memory die to which the block erase command is issued.

At operation 661, it can be determined (e.g., by the processor) whether a status of the issued block erase command has passed (e.g., has been successful). If it is determined that the block erase command has not passed (e.g., has not been successful), at operation 678 the block targeted by the block erase command that has not passed can be retired. If it is determined that the block erase command has passed (e.g., has been successful), at operation 662, a determination can be made as to whether the memory die that contains the block was fabricated at a center area 791 of a wafer 790 or if the memory die that contains the block was fabricated at an edge area 792 of the wafer 790. In some embodiments, this determination can be based on a determined fuse_ID of the memory die.

If it is determined that the memory die was fabricated within a center area 791 of the wafer 790, at operation 663 a determination can be made as to whether a program erase count (PEC) of the memory die is greater than or equal to a normal or expected PEC count for the memory die. If the PEC count of the memory die is not greater than or equal (e.g., is less than) to the normal or expected PEC count, the flow 660 can continue as indicated by the Arabic numeral "1" on the right side of the flow diagram 660 and, at operation 681, the block erase operation can be completed. If, however, the PEC count of the memory die is greater than or equal to the normal or expected PEC count, the flow 660 can continue to operations 664, 665, and/or 666 or the flow 660 can continue to operations 668, 669, and/or 670.

Returning to operation 662, if it is determined that the memory die was fabricated within an edge area 792 of the wafer 790, at operation 667 a determination can be made as to whether a PEC of the memory die is greater than or equal to a tight PEC count for the memory die. In some embodiments, a "tight PEC count" can correspond to performance of $V_T$ scans more frequently than a PEC count that is not "tight." Accordingly, in some embodiments, a "tight PEC count" can translates to a higher frequency of SG scan operation performance, which can allow for a tail of a $V_T$ distribution to be accurately or carefully monitored. If the PEC count of the memory die is not greater than or equal (e.g., is less than) to the tight PEC count, the flow 660 can continue to operation 681, and the block erase operation can be completed. If, however, the PEC count of the memory die is greater than or equal to the tight PEC count, the flow 660 can continue to operations 664, 665, and/or 666 or the flow 660 can continue to operations 668, 669, and/or 670.

Operations 664, 665, and 666 can correspond to operations to modulate a read level as described in connection with FIG. 5, herein. As indicated by the text that states "OR" in FIG. 6-1, the operations 664, 665, and 666 may be performed in the alternative to performance of operations 668, 669, and 670. For example, at operation 664, a first $V_T$ scan (e.g., a first low $V_T$ scan) can be issued to the memory die and/or to at least one select gate of the memory die. In some embodiments, the first $V_T$ scan can correspond to the read level 554-1 illustrated in FIG. 5. As part of modulating the read level, at operation 665, a second $V_T$ scan (e.g., a second low $V_T$ scan) can be issued to the memory die and/or to at least one select gate of the memory die. In some embodiments, the second $V_T$ scan can correspond to the read level 554-2 illustrated in FIG. 5. In further modulating the read level, at operation 666, a third $V_T$ scan (e.g., a third low $V_T$ scan) can be issued to the memory die and/or to at least one select gate of the memory die. In some embodiments, the third $V_T$ scan can correspond to the read level 554-Q illustrated in FIG. 5.

Operations 668, 669, and 670 can correspond to operations to modulate a one check fail byte scheme or "CFBYTE scheme" as described in connection with FIG. 4, herein. As indicated by the text that states "OR" in FIG. 6-1, the operations 668, 669, and 670 may be performed in the alternative to performance of operations 664, 665, and 666. For example, at operation 668, a first CFBYTE scan can be issued to the memory die and/or to at least one select gate of the memory die. In some embodiments, the first CFBYTE scan can correspond to the CFBYTE scan 442-P illustrated in FIG. 4. As part of modulating the CFBYTE scan, at operation 669, a second CFBYTE scan can be issued to the memory die and/or to at least one select gate of the memory die. In some embodiments, the second CFBYTE scan can correspond to the CFBYTE scan 442-2 illustrated in FIG. 4. In further modulating the CFBYTE scan level, at operation 670, a third CFBYTE scan can be issued to the memory die and/or to at least one select gate of the memory die. In some embodiments, the third CFBYTE scan can correspond to the CFBYTE scan 442-1 illustrated in FIG. 4.

At operation 671, the memory dice that are fabricated at the center of the wafer (CoW) can be deprioritized if memory dice fabricated at the edge of the wafer (EoW) are determined to exhibit greater degradation that the CoW memory dice. That is, a frequency at which select gate scan operations are performed involving the CoW memory dice can be reduced and/or a frequency at which select gate scan operations are performed involving the EoW memory dice can be increased or vice-versa. If it is determined that the EoW memory dice exhibit greater degradation than the CoW memory dice, a select gate (SG) touchup operation can be performed. As used herein, a "select gate touchup operation" generally refers to performance of a select gate program operation that targets particular memory dice (e.g., not all the memory dice concurrently) that have determined quality characteristics that are below a particular threshold. For example, the quality characteristics of EoW memory dice that exhibit greater degradation than the CoW memory dice can have quality characteristics that are below the particular threshold and can accordingly be targeted for a select gate scan operation or select gate touchup operation. As indicated by the dashed lines, a feedback loop from operation 671 to operations 663 and 667 can be performed to adjust the PEC counts and/or PEC intervals to monitor the select gate threshold voltages of the select gates in order to take corrective action (e.g., by performing a select gate touchup operation) before the threshold voltages of the select gates fall below a particular threshold to prevent the occurrence of an uncorrectable error event.

At operation 672, a determination can be made as to whether a select gate scan using a low $V_T$ has passed (e.g., has been successful) or has not passed (e.g., has been unsuccessful). If the select gate scan using the low $V_T$ has passed, at operation 679 a select gate scan using a high $V_T$ can be performed. At operation 680, a determination can made as to whether the select gate scan using the high $V_T$ has passed (e.g., has been successful) or has not passed (e.g., has been unsuccessful). If the select gate scan using the high $V_T$ has not passed, at operation 678, the memory block coupled to the select gate can be retired. In contrast, if the select gate scan using the high $V_T$ has passed, at operation 681 the block erase operation can be completed.

If, at operation 672, the select gate scan using the low $V_T$ has not passed, at operation 673, a select gate touchup operation can be performed. At operation 674, a determination can made as to whether a second (recheck) select gate scan using a low $V_T$ has passed (e.g., has been successful). If the second select gate scan using the low $V_T$ has not passed, at operation 675 the memory block coupled to the select gate can be retired. In contrast, if, at operation 674, the second select gate scan using the low $V_T$ has passed, at operation 676 a select gate scan using a high $V_T$ can be performed. At operation 677, a determination can made as to whether the select gate scan using the high $V_T$ has passed (e.g., has been successful) or has not passed (e.g., has been unsuccessful). If the select gate scan using the high $V_T$ has not passed, at operation 678, the memory block coupled to the select gate can be retired. In contrast, if the select gate scan using the high $V_T$ has passed, at operation 681 the block erase operation can be completed.

Figure 7:
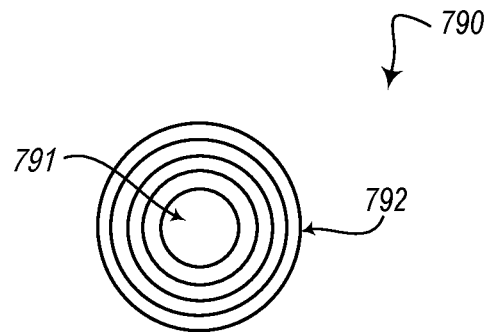
FIG. 7 illustrates an example wafer having a memory die that is manufactured at a center area of the wafer and a memory die that is manufactured at an edge area of the wafer in accordance with some embodiments of the present disclosure

FIG. 7 illustrates an example wafer 790 having a memory die that is manufactured at a center area 791 of the wafer 790 and a memory die that is manufactured at an edge area 792 of the wafer 790 in accordance with some embodiments of the present disclosure. Although illustrated as a circular object in FIG. 7, it will be appreciated that the wafer 790 can be manufactured and/or fabricated in various other shapes.

Individual memory dice are not shown in FIG. 7 so as to not obfuscate the drawings. However, it will be appreciated by one of ordinary skill in the art that multiple memory dice (e.g., the memory dice 231-1 to 231-X illustrated in FIG. 2) can be manufactured and/or fabricated at varying radial distances from the center of the wafer 790 illustrated in FIG. 7. For example, multiple memory dice can be manufactured and/or fabricated within the center area 791 while multiple memory dice can be manufactured and/or fabricated within the edge area 792. It will further be appreciated that multiple memory dice can be manufactured and/or fabricated within each of the unnumbered concentric circles that comprise the wafer 790 between the center area 791 and the edge area 792.

In general, due to process variation across the wafer 790 during manufacture and/or fabrication, the overall quality characteristics of memory dice can degrade as a function of the radial distance of such memory dice from the center area 791. Stated alternatively, the memory dice that are manufactured and/or fabricated at the center area 791 of the wafer 790 generally exhibit quality characteristics that are superior to the quality characteristics of memory dice that are manufactured and/or fabricated at the edge area 792 of the wafer 790. It follows that, in general, memory dice that are manufactured and/or fabricated within the intervening concentric circles of the wafer 790 illustrated in FIG. 7 generally exhibit quality characteristics that fall between the quality characteristics of memory dice that are manufactured and/or fabricated within the center area 791 of the wafer 790 and the memory dice that are manufactured and/or fabricated within the edge area 792 of the wafer 790.

Embodiments are not so limited, however, and in some embodiments, the overall quality characteristics of memory dice can improve as a function of the radial distance of such memory dice from the center area 791. Stated alternatively, the memory dice that are manufactured and/or fabricated at the edge area 792 of the wafer 790 can exhibit quality characteristics that are superior to the quality characteristics of memory dice that are manufactured and/or fabricated at the center area 791 of the wafer 790. In such scenarios, it follows that memory dice that are manufactured and/or fabricated within the intervening concentric circles of the wafer 790 illustrated in FIG. 7 generally exhibit quality characteristics that fall between the quality characteristics of memory dice that are manufactured and/or fabricated within the center area 791 of the wafer 790 and the memory dice that are manufactured and/or fabricated within the edge area 792 of the wafer 790, although embodiments are not so limited.

As mentioned above, information, such as a fuse_ID, can be associated with each memory die based on the respective location within the wafer 790 that each memory die is manufactured and/or fabricated. Accordingly, the fuse_ID associated with each memory die can be indicative of quality characteristics of the memory die to which the fuse_ID is associated. For example, a fuse_ID can be assigned at manufacture and/or during fabrication of the memory dice that is based on a distance from the center area 791 of the wafer 790 at which the memory dice were manufactured and/or fabricated.

The fuse_ID can further include information indicative of other process variations that can affect a memory die regardless of the distance from the center area 791 of the wafer 790 at which a memory die was manufactured and/or fabricated. For example, the fuse_ID can include information corresponding to doping profile variations associated with the memory die as a result of memory die fabrication processes, among other process variations. As described above, the fuse_ID can be indicative of quality characteristics of a memory die and can be used to determine a frequency at which select gate scan operations are performed and/or a voltage level applied to a select gate in performance of a select gate scan operation, among others.

Figure 8:
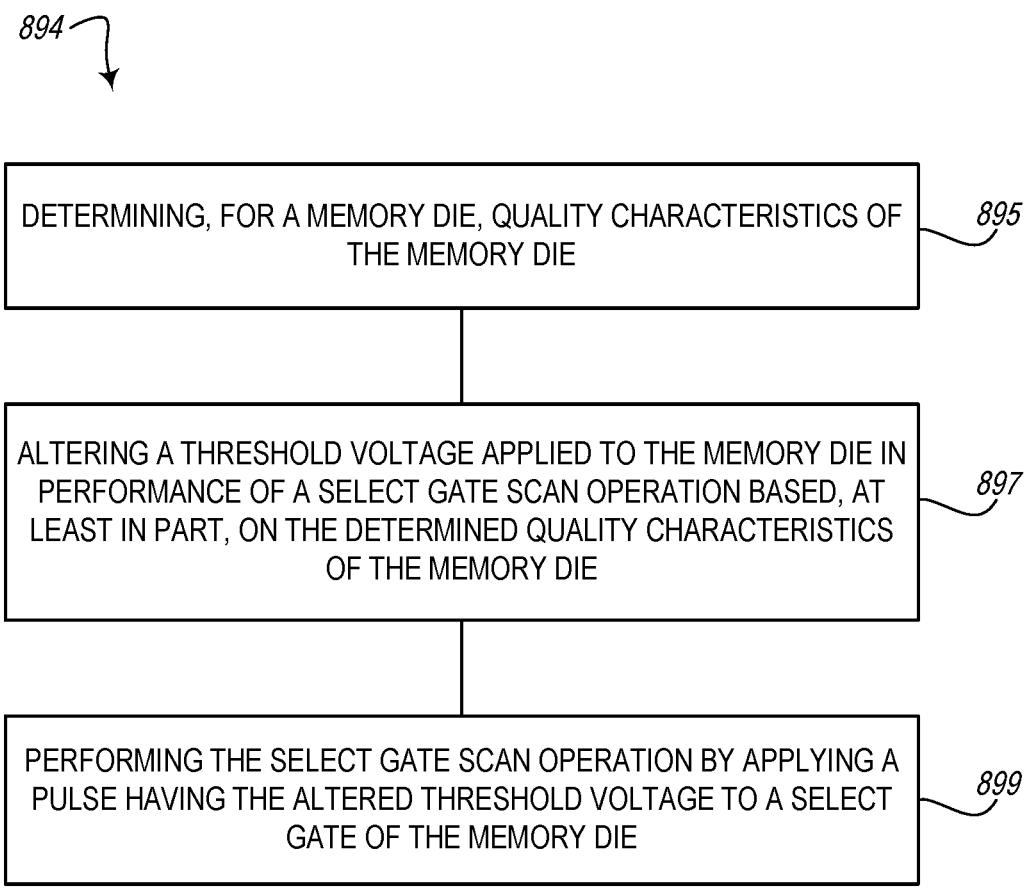
FIG. 8 is a flow diagram corresponding to a method for select gate scan operations in accordance with some embodiments of the present disclosure.

FIG. 8 is flow diagram corresponding to a method 894 for select gate scan operations in accordance with some embodiments of the present disclosure. The method 894 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 894 is performed by the select gate scan component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 895, the method 894 includes determining, for a memory die, quality characteristics of the memory die. The memory die can be analogous to one of the memory dice 231-1 to 231-X illustrated in FIG. 2, herein. As described above, the method 894 can include determining a distance from a particular location of a wafer at which the memory die was fabricated as part of determining the quality characteristics of the memory die. In some embodiments, the method 894 can include determining the quality characteristics of the memory die during runtime of a memory device associated with the memory die. For example, in some embodiments, the quality characteristics can be determined in real-time while the memory device is "in the field" and operating within a computing system.

At operation 897, the method 894 can include altering a threshold voltage applied to the memory die in performance of a select gate scan operation based, at least in part, on the determined quality characteristics of the memory die. At operation 899, the method 894 can include performing the select gate scan operation by applying signaling (e.g., a voltage pulse or other electromotive burst of energy) having the altered threshold voltage to a select gate of the memory die. The select gate can be analogous to the select gate (SG) 332 illustrated in FIG. 3, herein. The method 894 can further include altering a frequency at which the select gate scan operation is performed based, at least in part, on the determined quality characteristics of the memory die, as described above.

As described in more detail in connection with FIG. 4 and FIG. 5, herein, the method 894 can include determining, based on application of a modulated CFBYTE signal, a fail bit criteria corresponding to the memory die and determining the quality characteristics of the memory die based, at least in part, on the determined fail bit criteria. The method 894 can further include altering the threshold voltage applied to the memory die in performance of the select gate scan operation or a frequency at which the select gate scan operation is performed, or both, based, at least in part, on the determined quality characteristics of the memory die.

In some embodiments, as described in more detail in connection with FIG. 4 and FIG. 5, herein, the method 894 can include determining, based on application of a modulated read level signal, characteristics associated with a tail region of a voltage threshold corresponding to a select gate of the memory die and determining the quality characteristics of the memory die based, at least in part, on the characteristics associated with the tail region of the voltage threshold corresponding to the select gate. The method 894 can further include altering the threshold voltage applied to the memory die in performance of the select gate scan operation or a frequency at which the select gate scan operation is performed, or both, based, at least in part, on the determined quality characteristics of the memory die.

The method 894 can further include determining a quantity of program erase cycles experienced by the memory die and altering the threshold voltage applied to the memory die in performance of the select gate scan operation or a frequency at which the select gate scan operation is performed, or both, based, at least in part, on the determined quantity of program erase cycles experienced by the memory die. In some embodiments, the method 894 can further include performing the select gate scan operation by applying the signaling having the altered threshold voltage to the select gate of the memory die or altering the frequency at which the select gate scan operation is performed, or both, based at least in part on the determined quantity of program erase cycles experienced by the memory die.

Figure 9:
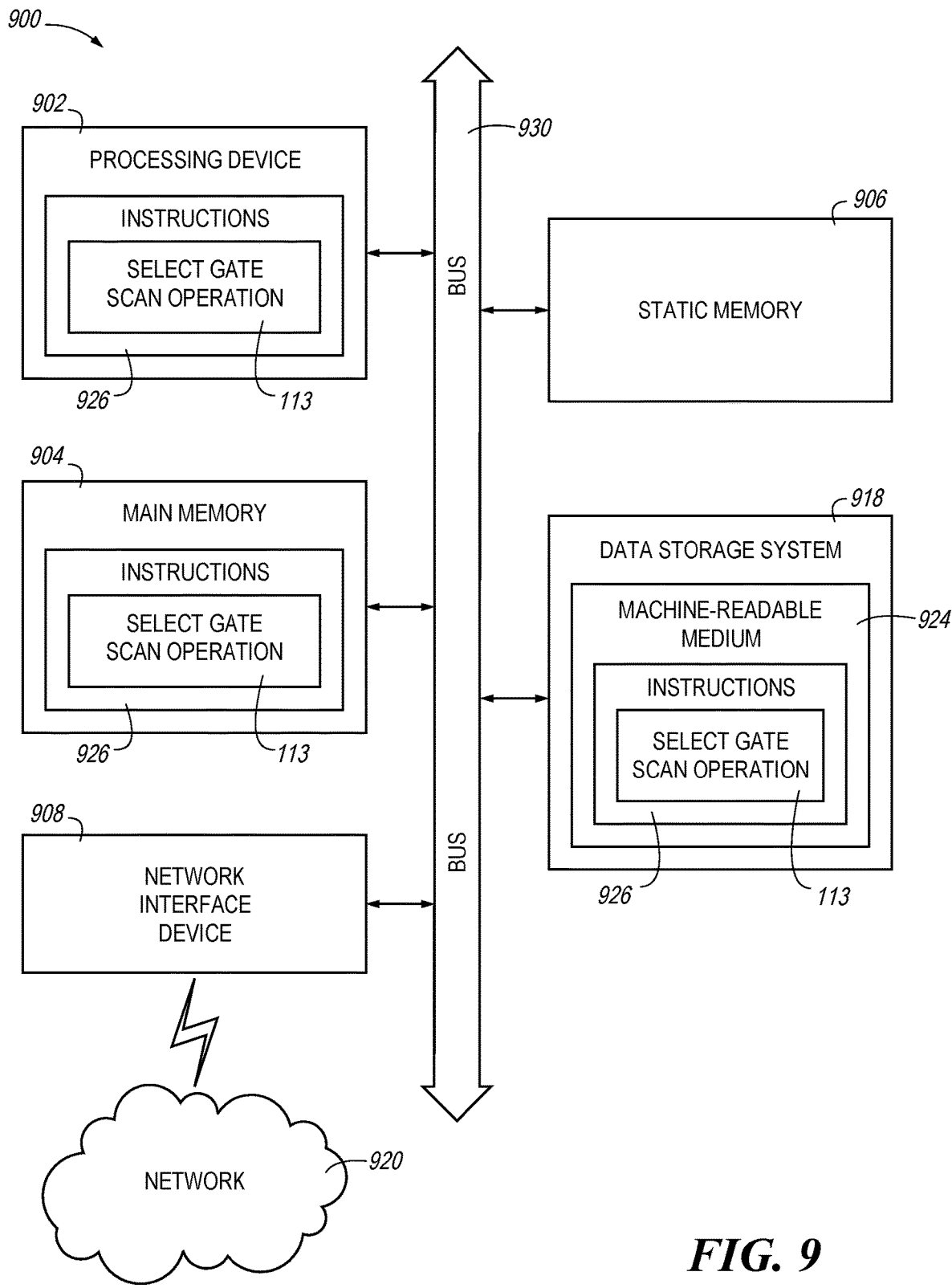
FIG. 9 is a block diagram of an example computer system in which embodiments of the present disclosure may operate.

FIG. 9 is a block diagram of an example computer system 900 in which embodiments of the present disclosure may operate. For example, FIG. 5 illustrates an example machine of a computer system 900 within which a set of instructions, for causing the machine to perform any one or more of the methodologies discussed herein, can be executed. In some embodiments, the computer system 900 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the select gate scan component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), etc.), and a data storage system 918, which communicate with each other via a bus 930.

The processing device 902 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 902 can also be one or more special-purpose processing devices such as an application specific integrated circuit (ASIC), a field programmable gate array (FPGA), a digital signal processor (DSP), network processor, or the like. The processing device 902 is configured to execute instructions 926 for performing the operations and steps discussed herein. The computer system 900 can further include a network interface device 908 to communicate over the network 920.

The data storage system 918 can include a machine-readable storage medium 924 (also known as a computer-readable medium) on which is stored one or more sets of instructions 926 or software embodying any one or more of the methodologies or functions described herein. The instructions 926 can also reside, completely or at least partially, within the main memory 904 and/or within the processing device 902 during execution thereof by the computer system 900, the main memory 904 and the processing device 902 also constituting machine-readable storage media. The machine-readable storage medium 924, data storage system 918, and/or main memory 904 can correspond to the memory sub-system 110 of FIG. 1.

In one embodiment, the instructions 926 include instructions to implement functionality corresponding to a select gate scan component (e.g., the select gate scan component 113 of FIG. 1). While the machine-readable storage medium 924 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
    determining, for a memory die, quality characteristics of the memory die, including:
        determining a distance from a particular location on a wafer to a location at which the memory die was fabricated;
    altering a threshold voltage applied to the memory die in performance of a select gate scan operation based, at least in part, on the determined quality characteristics of the memory die; and
    performing the select gate scan operation by applying signaling having the altered threshold voltage to a select gate of the memory die.

2. The method of claim 1, further comprising altering how frequently the select gate scan operation is performed based, at least in part, on the determined quality characteristics of the memory die.

3. The method of claim 1, further comprising:
    determining, based on application of a modulated check failure byte signal, a fail bit criteria corresponding to the memory die;
    determining the quality characteristics of the memory die based, at least in part, on the determined fail bit criteria; and
    altering the threshold voltage applied to the memory die in performance of the select gate scan operation or how frequently the select gate scan operation is performed, or both, based, at least in part, on the determined quality characteristics of the memory die.

4. The method of claim 1, further comprising:
    determining, based on application of a modulated read level signal, characteristics associated with a tail region of a voltage threshold corresponding to the select gate of the memory die;
    determining the quality characteristics of the memory die based, at least in part, on the characteristics associated with the tail region of the voltage threshold corresponding to the select gate; and
    altering the threshold voltage applied to the memory die in performance of the select gate scan operation or how frequently the select gate scan operation is performed, or both, based, at least in part, on the determined quality characteristics of the memory die.

5. The method of claim 1, further comprising determining the quality characteristics of the memory die during runtime of a memory device associated with the memory die.

6. The method of claim 1, further comprising:

determining a quantity of program erase cycles experienced by the memory die;
altering the threshold voltage applied to the memory die in performance of the select gate scan operation or how frequently the select gate scan operation is performed, or both, based, at least in part, on the determined quantity of program erase cycles experienced by the memory die; and
performing the select gate scan operation by applying the signaling having the altered threshold voltage to the select gate of the memory die or altering the frequency at which the select gate scan operation is performed, or both, based, at least in part, on the determined quantity of program erase cycles experienced by the memory die.

7. The method of claim 1, wherein the particular location on the wafer is in a center area of the wafer.

8. An apparatus, comprising:
a memory die resident on a memory device;
a select gate coupled to at least one string of memory cells of the memory die; and
a processor coupled to the memory device, wherein the processor is configured to:
determine quality characteristics of the memory die;
alter signaling applied to the select gate in performance of a select gate scan operation based, at least in part, on the determined quality characteristics of the memory die, wherein the signaling is altered such that the select gate scan operation is performed more frequently or less frequently than prior to the signaling being altered; and
perform the select gate scan operation using the altered signaling.

9. The apparatus of claim 8, wherein the altered signaling comprises signaling having an altered threshold voltage corresponding thereto.

10. The apparatus of claim 8, wherein the quality characteristics are based, at least in part, on a physical location at which the memory die was fabricated on a wafer.

11. The apparatus of claim 8, wherein the quality characteristics are based, at least in part, on doping profile variations associated with the memory die as a result of memory die fabrication processes.

12. The apparatus of claim 8, wherein the processor is further configured to:
determine a slope of a portion of a voltage threshold exhibited by the select gate during operation of the memory device; and
alter the signaling applied to the select gate in performance of the select gate scan operation based, at least in part, on the determined slope of the portion of the voltage threshold exhibited by the select gate during operation of the memory device.

13. The apparatus of claim 8, wherein the processor is further configured to:
determine a slope of a portion of a voltage threshold exhibited by the select gate during operation of the memory device; and
alter the signaling applied to the select gate in performance of the select gate scan operation based, at least in part, on a fail bit criteria exhibited by the select gate during operation of the memory device.

14. The apparatus of claim 8, wherein the processor is further configured to:
determine a quantity of bit failures exhibited by the select gate during operation of the memory device; and
alter the signaling applied to the select gate in performance of the select gate scan operation based, at least in part, on the determined quantity of bit failures exhibited by the select gate during operation of the memory device.

15. A system, comprising:
a plurality of memory dice resident on a memory device;
respective select gates coupled to respective strings of memory cells of respective memory dice of the plurality of memory dice; and
a processor coupled to the plurality of memory dice, wherein the processor is configured to:
determine quality characteristics of each memory die of the plurality of memory dice, wherein the quality characteristics are based, at least in part, on a physical location on a wafer at which each memory die was fabricated;
assign a ranking value to each memory die of the plurality of memory dice based on the determined quality characteristics of each memory die;
alter parameters associated with signaling indicative of a select gate scan operation involving at least one of the respective select gates based, at least in part, on the assigned ranking values; and
cause performance of the select gate scan operation involving the at least one of the respective select gates using the altered parameters associated with the signaling indicative of the select gate scan operation involving the at least one of the respective select gates.

16. The system of claim 15, wherein the processor is configured to alter the parameters associated with the signaling indicative of the select gate scan operation by altering how frequently the select gate scan operation is performed involving the at least one the respective select gates.

17. The system of claim 15, wherein the processor is configured to alter the parameters associated with the signaling indicative of the select gate scan operation by altering a voltage threshold applied to the at least one the respective select gates during performance of the select gate scan operation.

18. The system of claim 15, wherein the processor is further configured to:
monitor a slope associated with a portion of a voltage distribution associated with a voltage threshold of the at least one of the respective select gates; and
alter the parameters associated with the signaling indicative of the select gate scan operation involving the at least one of the respective select gates based on the monitored slope of the portion of the voltage distribution associated with the voltage threshold of the at least one of the respective select gates.

19. The system of claim 15, wherein the processor is further configured to:
monitor a quantity of bit failures detected in a particular time period for the at least one of the respective select gates; and
alter the parameters associated with the signaling indicative of the select gate scan operation involving the at least one of the respective select gates based on the monitored quantity of bit failures detected in the particular time period for the at least one of the respective select gates.

* * * * *